US012751068B2

(12) United States Patent
Yoshida et al.

(10) Patent No.: US 12,751,068 B2
(45) Date of Patent: Sep. 29, 2026

(54) SILICON CARBIDE SEMICONDUCTOR DEVICE AND POWER CONVERSION APPARATUS

(71) Applicant: Mitsubishi Electric Corporation, Tokyo (JP)

(72) Inventors: Motoru Yoshida, Tokyo (JP); Katsutoshi Sugawara, Tokyo (JP); Yoshitaka Kimura, Tokyo (JP); Yutaka Fukui, Tokyo (JP); Tetsuo Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 390 days.

(21) Appl. No.: 18/526,582

(22) Filed: Dec. 1, 2023

(65) Prior Publication Data

US 2024/0297229 A1 Sep. 5, 2024

(30) Foreign Application Priority Data

Mar. 2, 2023 (JP) ................................ 2023-031569

(51) Int. Cl.

*H10D 64/23* (2025.01)
*H02P 27/08* (2006.01)
*H10D 30/66* (2025.01)
*H10D 62/10* (2025.01)
(Continued)

(52) U.S. Cl.

CPC ......... *H10D 64/252* (2025.01); *H10D 30/668* (2025.01); *H10D 62/127* (2025.01); *H10D 62/8325* (2025.01); *H10D 64/62* (2025.01); *H02P 27/08* (2013.01)

(58) Field of Classification Search

CPC ........................... H10D 30/668; H10D 64/251
See application file for complete search history.

(56) References Cited

U.S. PATENT DOCUMENTS 5,915,180 A * 6/1999 Hara .................. H10D 62/8325 257/77
5,976,936 A * 11/1999 Miyajima .......... H10D 30/0297 257/E29.104
(Continued)

FOREIGN PATENT DOCUMENTS

JP 2007-019412 A 1/2007
JP 2008-078396 A 4/2008
(Continued)

OTHER PUBLICATIONS

"Notice of Reasons for Refusal" Office Action issued in JP 2023-031569; mailed by the Japanese Patent Office on Jan. 6, 2026.

*Primary Examiner* — Evren Seven
(74) *Attorney, Agent, or Firm* — Studebaker Brackett PLLC

(57) ABSTRACT

In a silicon carbide semiconductor device, in a plan view, a plurality of source contact holes is intermittently provided in a second direction along a trench gate, and a source electrode is provided on an insulating film and is electrically connected to a source layer via the plurality of source contact holes. Intermittent recesses reflecting the shapes of the plurality of source contact holes are provided on a surface of the source electrode on a side opposite to the semiconductor substrate.

19 Claims, 5 Drawing Sheets

(51) Int. Cl.
*H10D 62/832* (2025.01)
*H10D 64/62* (2025.01)

(56) References Cited

U.S. PATENT DOCUMENTS

| | | | | |
|---|---|---|---|---|
| 6,262,439 | B1 * | 7/2001 | Takeuchi | H10D 30/668 257/341 |
| 11,894,428 | B2 * | 2/2024 | Hatta | H10D 8/60 |
| 2002/0140026 | A1 * | 10/2002 | Ishikawa | H10D 30/668 257/E29.022 |
| 2004/0145011 | A1 * | 7/2004 | Hsu | H10D 30/63 257/E29.104 |
| 2005/0161732 | A1 * | 7/2005 | Mizukami | H10D 62/153 257/E29.313 |
| 2005/0173739 | A1 * | 8/2005 | Kusumoto | H10D 30/668 257/280 |
| 2010/0019314 | A1 * | 1/2010 | Kachi | H10D 30/0297 257/E21.585 |
| 2010/0059816 | A1 * | 3/2010 | Shimada | H10D 30/0297 257/334 |
| 2012/0156843 | A1 * | 6/2012 | Green | H10D 30/475 257/E21.441 |
| 2012/0319136 | A1 * | 12/2012 | Noborio | H10D 12/038 257/77 |
| 2014/0167151 | A1 * | 6/2014 | Yen | H10D 30/635 438/270 |
| 2017/0352733 | A1 | 12/2017 | Hoshi et al. | |
| 2019/0341308 | A1 | 11/2019 | Urakami et al. | |
| 2021/0288156 | A1 * | 9/2021 | Fukui | H10D 12/481 |
| 2022/0069121 | A1 * | 3/2022 | Nagakura | H10D 30/66 |
| 2023/0092855 | A1 | 3/2023 | Narita | |

FOREIGN PATENT DOCUMENTS

| | | | | |
|---|---|---|---|---|
| JP | 2018-117016 | A | 7/2018 | |
| JP | 2019-102726 | A | 6/2019 | |
| JP | 2019-195081 | A | 11/2019 | |
| JP | 2020-198425 | A | 12/2020 | |
| JP | 2023-005683 | A | 1/2023 | |
| WO | 2017/047284 | A1 | 3/2017 | |
| WO | WO-2019123601 | A1 * | 6/2019 | H10D 30/0297 |
| WO | 2022/137788 | A1 | 6/2022 | |

* cited by examiner

SILICON CARBIDE SEMICONDUCTOR DEVICE AND POWER CONVERSION APPARATUS

BACKGROUND OF THE INVENTION

Field of the Invention

The present disclosure relates to a silicon carbide semiconductor device and a power conversion apparatus.

Description of the Background Art

A power semiconductor device generally called a power device is used, for example, for a switching element that controls power supply to a load such as a motor. Various performances are required for a power device, and one of the most required performances is reduction in loss. Reduction in loss of a power device produces effects such as reduction in size and weight of the device, and thus leads to consideration for the global environment by reduction in energy consumption in a broad sense. In addition, these performances are required to be realized at as low a cost as possible.

As a power semiconductor element for satisfying such requirements, insulated gate semiconductor devices such as an IGBT (Insulated Gate Bipolar Transistor) and a MOSFET (Metal Oxide Semiconductor Field Effect Transistor) are widely used. In recent years, a MOSFET, an IGBT, and the like using wide-bandgap semiconductors such as silicon carbide (SiC) have been proposed. In addition, in order to reduce power loss of a silicon carbide semiconductor device by increasing channel density, a structure called a trench type has been proposed (for example, Japanese Patent Application Laid-Open No. 2018-117016).

In a conventional SiC-trench-type semiconductor device, if a plating film of nickel (Ni)/gold (Au) is used as a front metal film, Au corrosion may occur on a Ni surface. If stress is applied to the portion where the corrosion has occurred during inspection or mounting of a semiconductor element, a crack may occur in the front metal film. In particular, since SiC has a small linear expansion coefficient unlike silicon (Si), a difference between the linear expansion coefficient of the plating film and the linear expansion coefficient of a SiC substrate is large, and as a result, there is a problem that the stress of the front metal film increases and a crack is likely to occur. In addition, since a large current is used in SiC, heat is easily generated, and since the stress is large, there is a problem that a crack is likely to occur.

SUMMARY

The present disclosure has been made in view of the above problem, and an object thereof is to provide a technique capable of suppressing occurrence of cracks in a first metal film and a second metal film as a front metal film or the like.

A silicon carbide semiconductor device according to the present disclosure includes: a drift layer of a first conductivity type that is provided between a first main surface and a second main surface of a semiconductor substrate; a base layer of a second conductivity type that is provided on a first main surface side of the drift layer; a source layer of the first conductivity type that is selectively provided on a first main surface side of the base layer; a trench gate that has a gate electrode provided via a gate insulating film on an inner surface of each of a plurality of trenches, the plurality of trenches being provided side by side in a first direction and extending in a second direction in a plan view, and in contact with the base layer and the source layer in a cross-sectional view; an insulating film that has a plurality of source contact holes intermittently provided in the second direction along the trench gate in a plan view, and is provided on the first main surface in a cross-sectional view; a source electrode that is provided on the insulating film and electrically connected to the source layer via the plurality of source contact holes; a first metal film that is provided on the source electrode and contains nickel; and a second metal film that is provided on the first metal film and contains a metal having a lower ionization tendency than ionization tendency of the first metal film, and intermittent recesses reflecting shapes of the plurality of source contact holes are provided on a surface of the source electrode on a side opposite to the semiconductor substrate.

Occurrence of cracks in the first metal film and the second metal film as a front metal film or the like can be suppressed.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
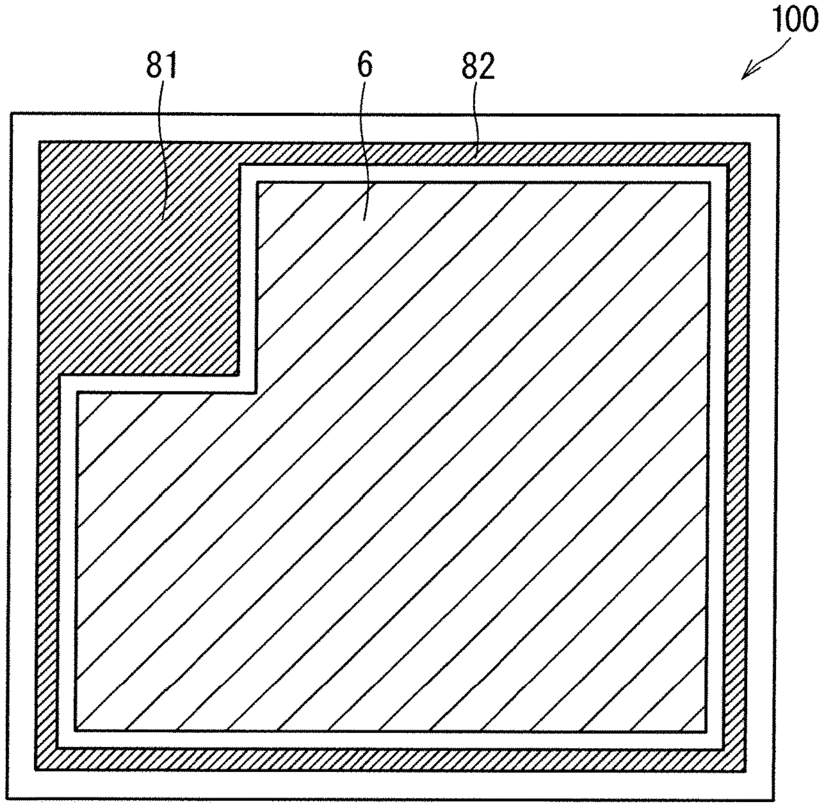
FIG. 1 is a plan view of a configuration of a MOSFET according to a first preferred embodiment as viewed from a front surface.

Hereinafter, preferred embodiments will be described with reference to the accompanying drawings. Features described in the following preferred embodiments are examples, and all features are not necessarily essential. In addition, in the following description, similar components in a plurality of preferred embodiments are denoted by the same or similar reference numerals, and different components will be mainly described. Furthermore, in the following description, specific positions and directions such as "upper", "lower", "left", "right", "front", or "back" may not necessarily coincide with actual positions and directions in implementation. In addition, the fact that a certain portion has a higher concentration than another portion means that, for example, the average of the concentrations of the certain portion is higher than the average of the concentrations of the other portion. In contrast, the fact that a certain portion has a lower concentration than another portion means that, for example, the average of the concentrations of the certain portion is lower than the average of the concentrations of the other portion. Furthermore, in the following description, the first conductivity type is an n-type and the second conductivity type is a p-type, but the first conductivity type may be a p-type and the second conductivity type may be an n-type.

First Preferred Embodiment

FIG. 1 is a plan view of a configuration of a MOSFET 100, which is a silicon carbide semiconductor device according to the present first preferred embodiment as viewed from a front surface. In the first preferred embodiment, a first main surface of a semiconductor substrate corresponds to the front surface, and a second main surface of the semiconductor substrate corresponds to a back surface. The semiconductor substrate May be a normal semiconductor wafer, an epitaxial growth layer, or a combination thereof. The silicon carbide semiconductor device may be an IGBT, an RC-IGBT (Reverse Conducting-IGBT), or the like, instead of the MOSFET 100. Note that, in FIG. 1, illustration of a gate insulating film, a field insulating film, an interlayer insulating film, a gate electrode, and a protective film in the configuration of the front surface of the MOSFET 100 is omitted for convenience.

In FIG. 1, a source electrode 6, a gate pad 81, and gate wiring 82 are provided on the front surface of the MOSFET 100. The gate pad 81 is provided on part of the front surface of the MOSFET 100, and receives a gate signal for controlling on/off of the MOSFET 100. The gate wiring 82 is connected to the gate pad 81 and is annularly provided along the end portion of the MOSFET 100. The source electrode 6 is provided adjacent to the gate pad 81 and is surrounded by the annular gate wiring 82.

Note that the gate pad 81 may be provided at an arbitrary position on the front surface of the MOSFET 100, for example, may be provided at a central portion. In addition, a control pad other than the gate pad 81 may be provided on the front surface of the MOSFET 100. The control pad other than the gate pad 81 includes, for example, at least one of a current sensing pad, a Kelvin source pad, and a temperature sensing diode pad. Note that in the present specification, for example, at least one of A, B, C, . . . , and Z means any one of all combinations obtained by extracting one or more from the group of A, B, C, . . . , and Z.

Next, the current sensing pad, the Kelvin source pad, and the temperature sensing diode pad will be described. The current sensing pad is a control pad for detecting a current flowing through a cell region of the MOSFET 100. The current sensing pad is electrically connected to the cell region such that a current which is a fraction of to one several tens of thousandth of the current flowing through the entire cell region flows through a partial region of the entire cell region when the current flows through the cell region of the MOSFET 100. The Kelvin source pad is a control pad to which a gate driving voltage for controlling on/off of the MOSFET 100 is applied.

The temperature sensing diode pad is a control pad electrically connected to the anode and the cathode of a temperature sensing diode provided in the MOSFET 100. The voltage between the anode and cathode of the temperature sensing diode provided in the cell region is measured via the temperature sensing diode pad, and the temperature of the MOSFET 100 is measured on the basis of the voltage. Note that the control pad other than the gate pad 81 may be provided at an arbitrary position on the front surface of the MOSFET 100, for example, may be provided at an end portion or the central portion.

Figure 2:
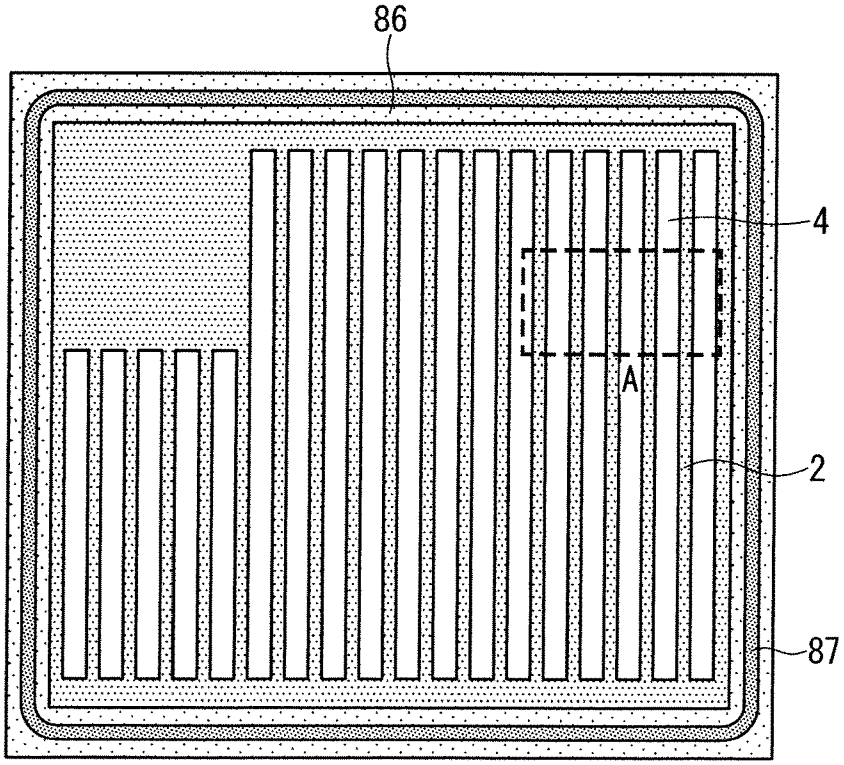
FIGS. 2 and 3 are plan views of a configuration of part of the MOSFET according to the first preferred embodiment as viewed from the front surface.

FIG. 2 is a plan view illustrating a configuration of a portion slightly advanced from the front surface to the back surface side in FIG. 1, and specifically, is a plan view illustrating a configuration of a portion where a base layer 2 is provided. In the MOSFET 100 illustrated in FIG. 2, a unit cell region including a p-type first well region corresponding to the base layer 2 and a trench gate 4 having a trench-type gate electrode is repeatedly arranged in a stripe shape in a plan view. A region including the p-type first well region corresponding to the base layer 2 is referred to as an active region, and a region provided with a p-type second well region 86 and a p-type JTE region 87 on the outer periphery of the active region is referred to as a termination region. The impurity concentration of the JTE region 87 selectively provided in the second well region 86 is lower than the impurity concentration of the second well region 86. Instead of the JTE region 87, an FLR (Field Limiting Ring) may be provided, or a combination of the JTE region 87 and the FLR may be provided.

Note that although not illustrated, a termination trench may be provided in the termination region, and the second well region 86 and the JTE region 87 may be provided at a bottom portion of the termination trench. The depth of an outer peripheral step portion may be equal to or greater than the depth of the trench of the trench gate 4. The gate wiring 82 may be provided on the termination region, and a source contact hole of the source electrode 6 may not be provided on the termination region side of an end portion of the trench gate 4. That is, the source contact hole may not be provided in the region where the second well region 86 and the JTE region 87 are provided at a lower portion of the termination trench.

Figure 3:
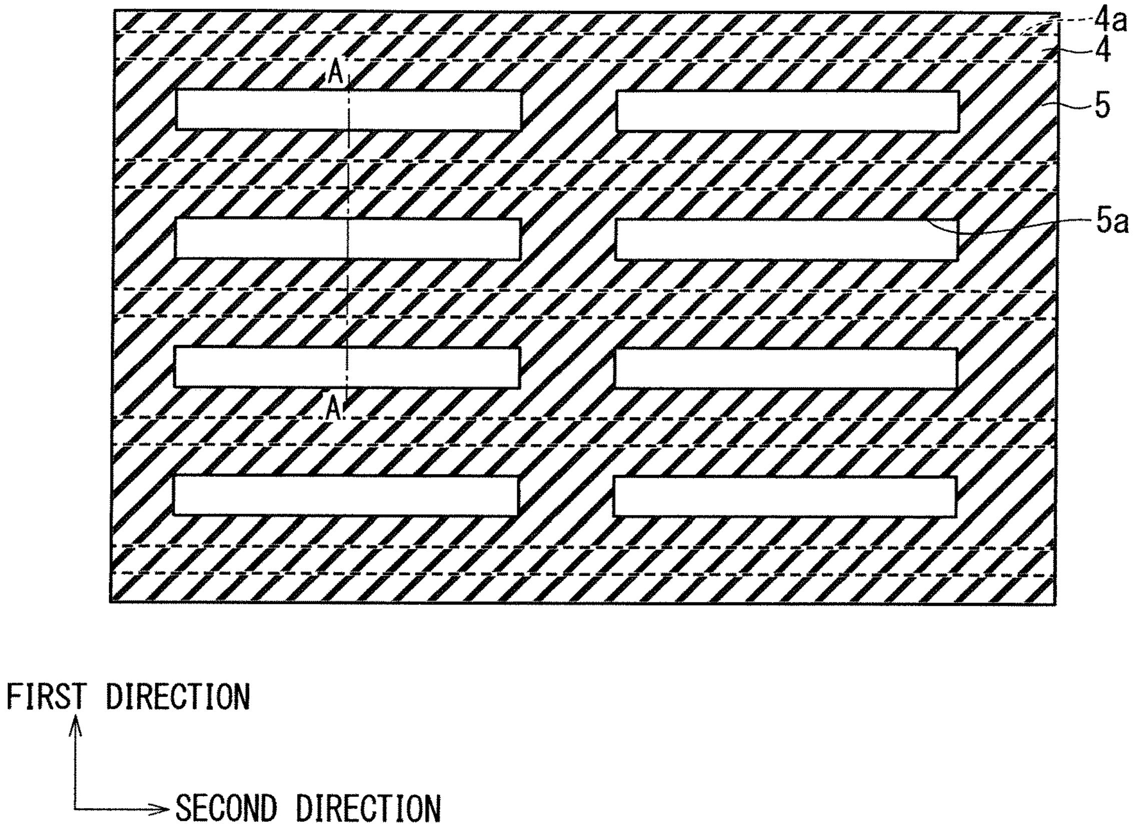

FIG. 3 is an enlarged view of a portion surrounded by a dotted line A in FIG. 2, and is an enlarged plan view of part of the cell region in the MOSFET 100 according to the present first preferred embodiment as viewed from the front surface. Note that for convenience, FIG. 3 illustrates only a plurality of trenches 4*a* in which a plurality of trench gates 4 is provided, respectively, a plurality of source contact holes 5*a*, and an interlayer insulating film 5 that is an insulating film having the plurality of source contact holes 5*a*.

As illustrated in FIG. 3, the plurality of trenches 4*a* is provided side by side in the first direction and extends in the second direction in a plan view. Similarly, the plurality of trench gates 4 provided in the plurality of trenches 4*a*, respectively, is arranged side by side in the first direction and extends in the second direction.

In a plan view, the plurality of source contact holes 5*a* is provided between the trench gates 4 adjacent to each other in the first direction, and is intermittently provided in the second direction along the trench gate 4. Since the plurality of source contact holes 5*a* is intermittently provided in the second direction while the trench gate 4 extends in the second direction, the length of the source contact hole 5*a* in the second direction is shorter than the length of the trench gate 4 in the second direction.

Figure 4:
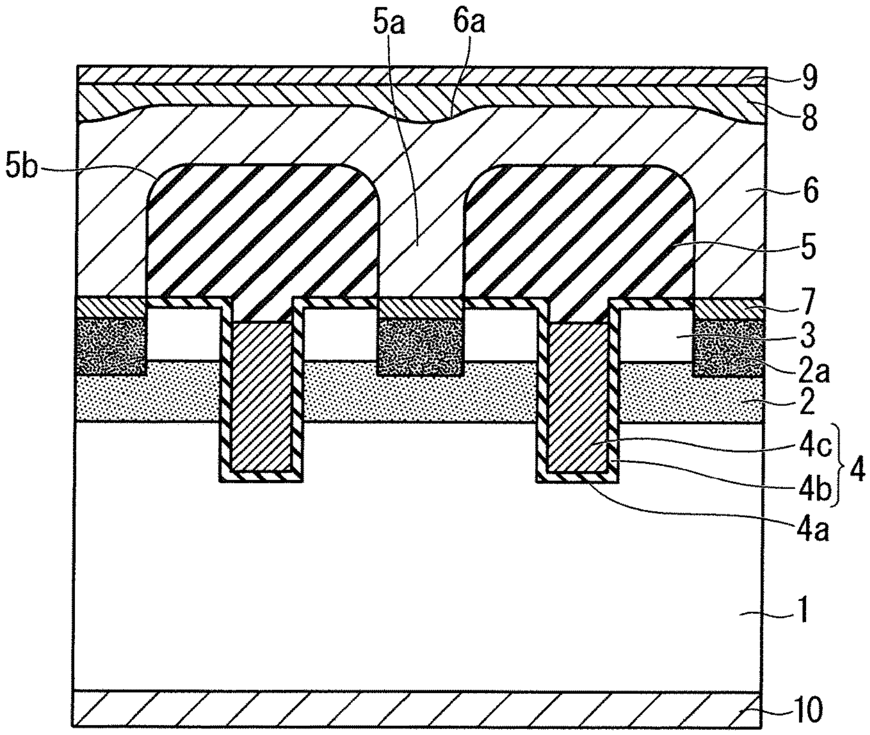
FIG. 4 is a cross-sectional view schematically illustrating the configuration of the MOSFET according to the first preferred embodiment.

FIG. 4 is a cross-sectional view taken along line A-A in FIG. 3, schematically illustrating the configuration of the MOSFET 100 according to the present first preferred embodiment. The MOSFET 100 of FIG. 4 includes an n-type drift layer 1, the p-type base layer 2 having a $p^+$-type contact layer 2*a*, an $n^+$-type source layer 3, a gate insulating film 4*b*, a gate electrode 4*c*, the interlayer insulating film 5, the source electrode 6, an ohmic electrode 7, a first metal film 8, a second metal film 9, and a drain electrode 10. Note that each of the plurality of trench gates 4 includes the gate insulating film 4*b* and the gate electrode 4*c*.

The drift layer 1 is provided between the front surface and the back surface of an n-type semiconductor substrate made of low-resistance silicon carbide. In the example of FIG. 4, the front surface of the semiconductor substrate corresponds to the upper surfaces of the source layer 3 and the contact layer 2*a*, and the back surface of the semiconductor substrate corresponds to the lower surface of the drift layer 1.

The base layer 2 is provided on the front surface side of the drift layer 1. In the present first preferred embodiment, the shape of the base layer 2 in a plan view has a plurality of separated stripes as illustrated in FIG. 2. However, the shape of the base layer 2 in a plan view is not limited to this, and may have stripes that are partially connected.

The source layer 3 in FIG. 4 is selectively provided on the front surface side of the base layer 2. In the present first preferred embodiment, the base layer 2 includes the contact layer 2*a*. The side portion of the contact layer 2*a* is provided in contact with the side portion of the source layer 3, and the concentration of the p-type impurity in the contact layer 2*a* is higher than the concentration of the p-type impurity in the base layer 2 excluding the contact layer 2*a*. In a case where the base layer 2 and the contact layer 2*a* need to be distinguished from each other, they may be individually referred to, and in a case where the base layer 2 and the contact layer 2*a* do not need to be distinguished from each other, they may be collectively referred to as the base layer 2.

As described above, the plurality of trenches 4*a* is arranged side by side in the first direction and extends in the second direction in a plan view of FIG. 3. Each of the plurality of trenches 4*a* is provided so as to reach the drift layer 1 from the upper surface of the source layer 3 in the cross-sectional view of FIG. 4, and is in contact with the side portion of the base layer 2 and the side portion of the source layer 3.

The gate insulating film 4*b* is provided on the inner surface of each trench 4*a*. The gate electrode 4*c* is provided on the inner surface of each trench 4*a* via the gate insulating film 4*b*, and faces the base layer 2 and the source layer 3 via the gate insulating film 4*b*. Note that although not illustrated, the gate electrode 4*c* is electrically connected to the gate wiring 82 in FIG. 1.

The interlayer insulating film 5 is provided on the front surface of the semiconductor substrate. The interlayer insulating film 5 has the plurality of source contact holes 5*a*. As described with reference to FIG. 3, in a plan view, the plurality of source contact holes Sa is provided between the trench gates 4 adjacent to each other in the first direction, and is intermittently provided in the second direction along the trench gate 4. Although not illustrated, each source contact hole 5*a* overlaps the contact layer 2*a* and the source layer 3 in a plan view. Note that in the present first preferred embodiment, as illustrated in FIG. 4, in a cross-sectional view, a curved surface 5*b* is provided between a side surface of the interlayer insulating film 5 in contact with the source contact hole 5*a* and a surface of the interlayer insulating film 5 on a side opposite to the semiconductor substrate (that is, the upper surface in FIG. 4).

The source electrode 6 is provided on the interlayer insulating film 5 and is electrically connected to the source layer 3 via the plurality of source contact holes 5*a*. Intermittent recesses 6*a* reflecting the shapes of the plurality of source contact holes 5*a* are provided on a surface of the source electrode 6 on a side opposite to the semiconductor substrate (that is, the upper surface of the source electrode 6 in FIG. 4). It is sufficient that the material of the source electrode 6 is metal, and may be, for example, may be an aluminum alloy such as an aluminum silicon alloy (Al—Si-based alloy).

The ohmic electrode 7 is a silicide layer containing nickel and provided at a bottom portion of the source contact hole 5*a*. That is, the ohmic electrode 7 is provided on at least one of the contact layer 2*a* and the source layer 3 exposed from the source contact hole 5*a*. The ohmic electrode 7 makes ohmic connection between the source electrode 6 and at least one of the base layer 2 and the source layer 3. Note that the ohmic electrode 7 is not essential for the MOSFET 100 according to the present first preferred embodiment.

A barrier metal, not illustrated, may be formed on a region of the front surface of the semiconductor substrate where the interlayer insulating film 5 is not provided and on the interlayer insulating film 5. For example, the barrier metal may be a conductor containing titanium (Ti), may be titanium nitride (TiN), or may be titanium silicide (TiSi) obtained by alloying titanium and silicon (Si). In addition, the barrier metal may be provided only on an n-type semiconductor layer such as the source layer 3. The barrier metal and the source electrode 6 may be collectively referred to as a source electrode. Note that in the configuration in which the width of the source contact hole 5*a* provided in the interlayer insulating film 5 is narrow, the source electrode 6 may not be satisfactorily embedded in the source contact hole 5*a*. In such a case, tungsten having better embeddability than the source electrode 6 may be formed in the source contact hole 5*a*, and then the source electrode 6 may be formed on the tungsten.

The first metal film 8 is provided on the source electrode 6 and contains nickel (Ni). The second metal film 9 is provided on the first metal film 8 and contains gold (Au). The material of the second metal film 9 is not limited to gold, and it is sufficient that the second metal film 9 contains a metal having a lower ionization tendency than that of the first metal film 8. The first metal film 8 and the second metal film 9 are formed as plating films by electroless plating, for example. Note that, like the recesses 6*a* of the source electrode 6, intermittent recesses reflecting the shapes of the plurality of source contact holes 5*a* may be provided on the upper surfaces of the first metal film 8 and the second metal film 9.

The drain electrode 10 is provided on the back surface of the semiconductor substrate, that is, the lower surface of the drift layer 1, and is electrically connected to the drift layer 1. The material of the drain electrode 10 may be an aluminum alloy similarly to the source electrode 6, may include an aluminum alloy and a plating film, may include titanium silicide, or may be different from the material of the source electrode 6.

According to the above configuration, the plurality of source contact holes 5*a* is intermittently provided along the trench gate 4, and the intermittent recesses 6*a* reflecting the shapes of the plurality of source contact holes 5*a* are provided on the surface of the source electrode 6 on a side opposite to the semiconductor substrate. Although details will be described later, according to such a configuration, when the first metal film 8 and the second metal film 9 are formed as a front metal film on the source electrode 6 by plating, corrosion of the metal (for example, Au) of the second metal film 9 due to the recesses 6*a* is intermittent along the trench gate 4. In such a configuration, corrosion of the metal of the second metal film 9 can be suppressed as compared with the configuration in which a continuous recess is provided on the upper surface of the source electrode 6, so that occurrence of cracks in the front metal film due to stress applied to the corroded portion in the subsequent processing or the like can be suppressed. This is particularly effective in the silicon carbide semiconductor device in which relatively large stress tends to be applied to the front metal film.

Note that the current density of the source electrode 6 in the plurality of intermittently provided source contact holes 5*a* is smaller than the current density of the source electrode in one continuous source contact hole. Therefore, the opening area of each of the plurality of source contact holes 5*a* intermittently provided is desirably as large as possible. In addition, the recess 6*a* of the source electrode 6 preferably has a depth at which corrosion of metal (for example, Au) of the second metal film 9 is suppressed to 0.1 μm or less.

<Manufacturing Method>

Next, a method of manufacturing the MOSFET 100 according to the present first preferred embodiment will be described.

First, an n-type semiconductor wafer made of low-resistance silicon carbide having a 4H polytype in which the plane orientation of the front surface is a (0001) plane having an off angle is prepared. Then, an n-type epitaxial growth layer made of silicon carbide having an impurity concentration of $1\times10^{15}$ $cm^{-3}$ to $1\times10^{17}$ $cm^{-3}$ and a thickness of 5 μm to 50 μm is formed on the semiconductor wafer by a chemical vapor deposition (CVD) method. In this case, the semiconductor wafer substrate and the epitaxial growth layer are included in the semiconductor substrate.

In the semiconductor wafer substrate and the epitaxial growth layer, a portion where an impurity layer such as the base layer 2 is not formed in the subsequent processing becomes the drift layer 1. Since the semiconductor wafer substrate and the epitaxial growth layer generally correspond to the drift layer 1, the semiconductor wafer substrate and the epitaxial growth layer may be referred to as the drift layer 1 for convenience in the following description.

Next, appropriate ion implantation is performed in a region of a predetermined location and depth using a general photolithography technique and an ion implantation technique. For example, an implantation mask is formed by a photoresist or the like except for a predetermined place on the front surface of the drift layer 1, and aluminum (Al), which is a p-type impurity is ion-implanted. At this time, the depth of Al ion implantation is set not to exceed the thickness of the drift layer 1 (for example, about 0.5 μm to 3 μm). In addition, the impurity concentration of ion-implanted Al ranges from $1\times 10^{17}$ $cm^{-3}$ to $1\times10^{19}$ $cm^{-3}$, for example, and is higher than the impurity concentration of the drift layer 1. Thereafter, the implantation mask is removed. The region which is p-type in the region implanted with Al ions in the present step is activated by heat treatment described later to become the base layer 2 (excluding the contact layer 2*a*) of the active region and the second well region 86 of the termination region.

Then, an implantation mask is formed by a photoresist or the like such that a predetermined place on the front surface of the base layer 2 is exposed, and nitrogen (N), which is an n-type impurity is ion-implanted. The ion implantation depth of N is made shallower than the thickness of the base layer 2. In addition, the impurity concentration of ion-implanted N is, for example, in the range of $1\times10^{18}$ $cm^{-3}$ to $1\times10^{21}$ $cm^{-3}$, and is higher than the p-type impurity concentration of the base layer 2. Thereafter, the implantation mask is removed. The region which is n-type in the region implanted with N ions in the present step is activated by heat treatment described later to become the source layer 3.

Next, an etching mask member is formed using a general photolithography technique or the like except for a predetermined place where the trench 4*a* is to be formed in the base layer 2. As the etching mask member, for example, a photoresist may be used, or a plasma insulating film formed using a photoresist or the like may be used. Then, the portion exposed from the etching mask member is etched to form the trench 4*a*. Note that not only the trench 4*a* but also the termination trench having a predetermined depth may be formed at a predetermined location such as the termination region. The trench 4*a* and the termination trench can be formed by reactive ion etching or the like. The trench 4*a* and the termination trench may be formed simultaneously, or may be formed at different timings.

Then, an implantation mask is formed by a photoresist or the like except for a predetermined place on the front surface of the termination region, and Al, which is a p-type impurity is ion-implanted. At this time, the depth of Al ion implantation is set not to exceed the thickness of the drift layer 1 (for example, about 0.5 μm to 3 μm). In addition, the impurity concentration of ion-implanted Al ranges from $1\times10^{16}$ $cm^{-3}$ to $1\times10^{18}$ $cm^{-3}$, for example, and is higher than the impurity concentration of the drift layer 1 and lower than the impurity concentration of the base layer 2. Thereafter, the implantation mask is removed. The region which is p-type in the region implanted with Al ions in the present step is activated by heat treatment described later to become the JTE region 87 of the termination region. Similarly, an implantation mask is formed by a photoresist or the like except for a predetermined place on the front surface of the base layer 2, and Al is ion-implanted at an impurity concentration in a range of $1\times10^{18}$ $cm^{-3}$ to $1\times10^{21}$ $cm^{-3}$ higher than the impurity concentration of the base layer 2. Thereafter, the implantation mask is removed. The region which is p-type in the region implanted with Al ions in the present step is activated by heat treatment described later to become the $p^+$-type contact layer 2*a*.

After various impurities are introduced by ion implantation as described above, the semiconductor substrate is heat-treated to diffuse and activate the impurities in the base layer 2 and the like. For example, the semiconductor substrate is annealed at a temperature of 1300 to 1900° C. for 30 seconds to 1 hour in an inert gas atmosphere such as argon (Ar) gas by a heat treatment apparatus. By this annealing, the ion-implanted N and Al are electrically activated. In the present first preferred embodiment, the heat treatment is performed after all the impurities are implanted, but the present disclosure is not limited thereto, and for example, implantation of impurities and heat treatment for diffusion and activation may be alternately performed.

Next, an insulating film to be a field insulating film, not illustrated, is formed on the front surface of the semiconductor substrate. The insulating film may be formed by thermal oxidation or the like, or may be formed by a deposition method (that is, deposition). The thickness of the insulating film is determined in consideration of the loss in cleaning in the subsequent step and an etching step. For example, a field insulating film made of silicon oxide is formed on a region (for example, a region of the gate pad, a region of the sensing pad, the termination region, and the like) excluding the active region corresponding to the base layer 2 by using a CVD method, a photolithographic technique, or the like. The film thickness of the field insulating film is, for example, 0.5 μm to 2 μm, and is larger than the film thickness of the gate insulating film 4*b* to be described next.

Then, the trench 4*a* of the silicon carbide substrate not covered with the field insulating film is thermally oxidized to form a silicon oxide film having a desired thickness as the gate insulating film 4*b*. Note that the method and material of forming the gate insulating film 4*b* are not limited to them.

Thereafter, a conductive polycrystalline silicon film is formed on the gate insulating film 4*b* and the field insulating film by a low-pressure CVD method, and patterned to form the gate electrode 4*c*. Note that the method and material of forming the gate electrode 4*c* are not limited to them.

Next, an insulating film having a film thickness larger than that of the gate insulating film 4*b* and made of silicon oxide is formed on the front surface of the semiconductor substrate by a low-pressure CVD method. This insulating film may be BPSG (Boro-Phospho Silicate Glass) containing B (boron) and P (phosphorus), or may be a laminated film of BPSG and silicon oxide without impurities. Next, the deposited insulating film is etched and subjected to mask patterning using a photolithography technique. As a result, as illustrated in FIG. 3, the interlayer insulating film 5 having the plurality of source contact holes 5*a* intermittently provided in the second direction along the trench gate 4 is formed.

Next, a metal film (for example, a Ni film) containing Ni as a main component is formed on the entire front surface side of the semiconductor substrate by, for example, a sputtering method or the like. Then, heat treatment is performed at a temperature of 600° C. to 1100° C. to react the metal film containing Ni as a main component with the semiconductor substrate exposed from the source contact hole 5*a*, thereby forming a silicide layer therebetween. Thereafter, the remaining metal film containing Ni as a main component on the interlayer insulating film 5 and the like is removed by wet etching using sulfuric acid-hydrogen peroxide mixture or the like to form the ohmic electrode 7.

Then, a metal film containing Al or AlSi is formed on the entire front surface side of the semiconductor substrate by, for example, sputtering or the like, a mask having a mask pattern is formed using a photolithography technique, and the deposited metal film is etched. Thus, the gate pad 81 and the gate wiring 82 in contact with the gate electrode 4*c*, the source electrode 6, and various pads are formed.

At the time of forming the metal film, the recesses 6*a* reflecting the pattern of the plurality of underlying source contact holes 5*a* are formed on the surface of the metal film on a side opposite to the semiconductor substrate. Since the plurality of source contact holes 5*a* is provided intermittently in the second direction along the trench gate 4, the recesses 6*a* are also intermittently provided in the second direction along the trench gate 4.

Next, a polyimide film, not illustrated, is formed on the source electrode 6, a mask having a mask pattern is formed using a photolithography technique, and the polyimide film is etched. Then, an electroless plating film containing Ni or a Ni compound is formed as the first metal film 8 on the source electrode 6 on which no polyimide film is provided. Finally, an electroless plating film containing Au for preventing oxidation of the first metal film 8 is formed as the second metal film 9 on the first metal film 8.

Similarly to formation of the source electrode 6, a metal film containing Al or AlSi is formed on the entire back surface side of the semiconductor substrate by, for example, sputtering or the like, a mask having a mask pattern is formed using a photolithography technique, and the metal film is etched to form the drain electrode 10.

Summary of First Preferred Embodiment

The recess of the source electrode 6 caused by the source contact hole causes a recess to be formed on the surface of the first metal film 8 on a side opposite to the semiconductor substrate. The recess of the first metal film 8 causes corrosion of the metal (for example, Au) of the second metal film 9 at the time of forming the second metal film 9, which is an electroless plating film. The reason for this corrosion is considered to be that the density of Ni or the like which is an electroless plating film is sparser in the recess than in the flat portion, and when the second metal film 9 is patterned, the sparse portion is easily etched, and the portion of the second metal film 9 in contact with the sparse portion is etched. For example, in a case where the electroless plating film is NiP, the concentration of P in the recess becomes higher than that in the periphery, so that the electroless plating film in the recess becomes brittle.

If the source contact holes are provided not intermittently but continuously in the second direction along the trench gate 4, the recesses of the source electrode 6 and the first metal film 8 become continuous, and corrosion of the second metal film 9 continuously occurs along the recess. In this case, when stress is applied to the corroded portion in the subsequent processing or the like, there is a problem that a crack occurs in the front metal film including the first metal film 8 and the second metal film 9 starting from the corroded portion. Note that the stress includes thermal or mechanical stress at the time of inspection or mounting of the MOSFET 100, and specifically includes stress generated when wire bonding is performed on the second metal film 9, stress generated when an encapsulant made of an epoxy resin is provided on the second metal film 9, and the like.

In contrast, in the present first preferred embodiment, the source contact holes 5*a* are intermittently provided in the second direction along the trench gate 4, and the recesses of the source electrode 6 and the first metal film 8 are intermittent, so that corrosion of the second metal film 9 as a starting point of a crack is discontinuous. As a result, the strength of the front metal film against stress can be increased, so that occurrence of cracks in the front metal film due to stress can be suppressed. This is particularly effective in the silicon carbide semiconductor device in which relatively large stress tends to be applied to the front metal film.

In addition, in the present first preferred embodiment, the ohmic electrode 7 makes ohmic connection between the source electrode 6 and at least one of the base layer 2 and the source layer 3. The ohmic electrode 7 can optimize the current between the source electrode 6 and the drain electrode 10. In addition, the ohmic electrode 7 allows the contact layer 2*a* of the base layer 2 to easily exchange electrons and holes with the source electrode 6.

Furthermore, in the present first preferred embodiment, in a cross-sectional view, the curved surface 5*b* is provided between the side surface of the interlayer insulating film 5 in contact with the source contact hole Sa and the surface of the interlayer insulating film 5 on a side opposite to the semiconductor substrate (that is, the upper surface in FIG. 4). According to such a configuration, when the source electrode 6 is filled in the source contact hole 5*a* during manufacturing, it is possible to suppress generation of a cavity (that is, a shrinkage cavity) in the source electrode 6.

First Modification

Figure 5:
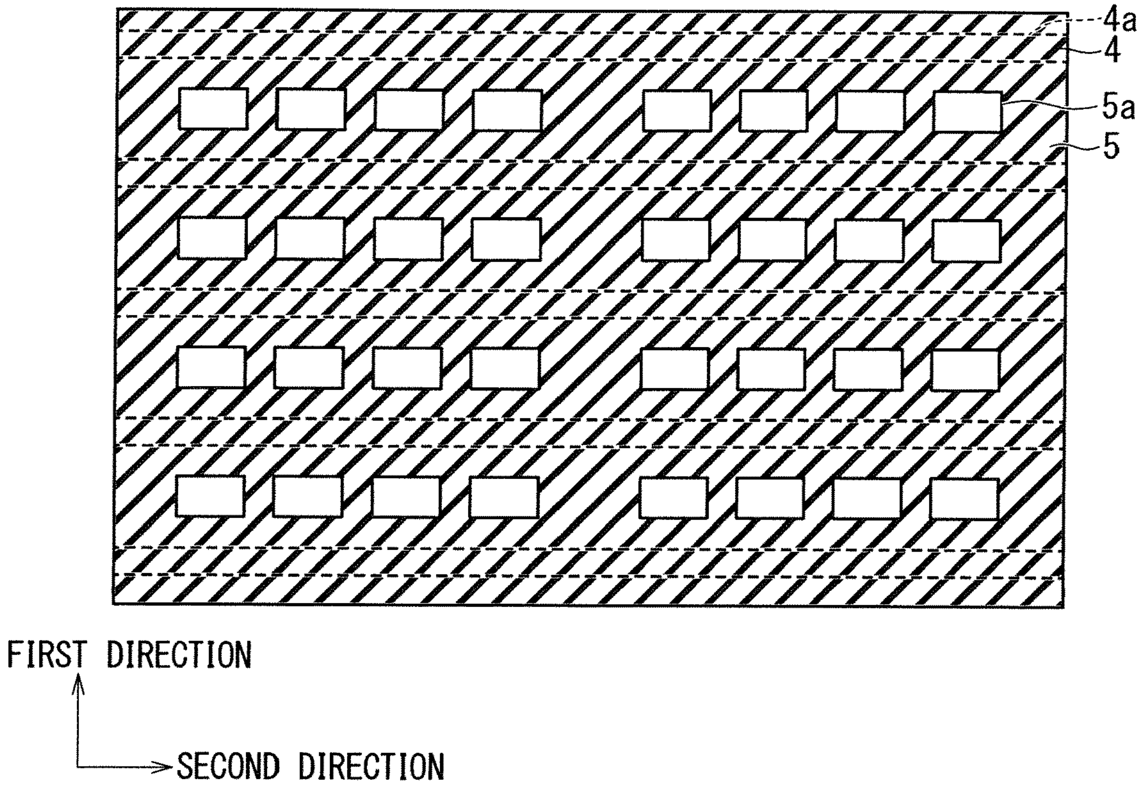
FIGS. 5 and 6 are plan views of a configuration of part of a MOSFET according to a first modification as viewed from a front surface.

FIG. 5 is an enlarged plan view of part of the cell region in the MOSFET 100 according to the first modification as viewed from the front surface, and is a view corresponding to FIG. 3. As illustrated in FIG. 5, the source contact hole 5*a* in a plan view may have a relatively short line shape, and the source contact hole 5*a* in a plan view may have a rectangular shape, a circular shape, or a square shape. According to such a configuration, since the recesses of the source electrode 6 and the first metal film 8 can be made intermittent, occurrence of cracks can be suppressed.

Figure 6:
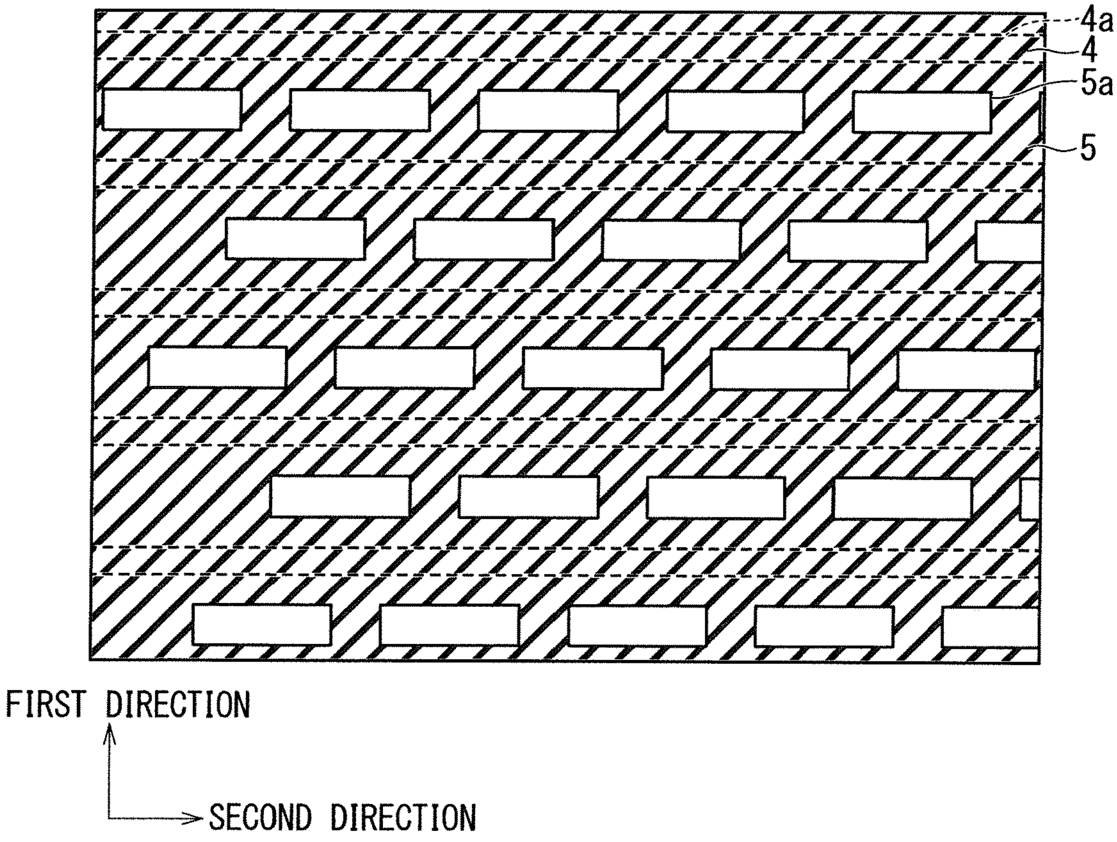

FIG. 6 is an enlarged plan view of part of the cell region in the MOSFET 100 according to the present first modification as viewed from the front surface, and is a view corresponding to FIG. 3. As illustrated in FIG. 6, the plurality of source contact holes 5*a* in a plan view may be arranged side by side in the first direction and may be arranged asymmetrically with respect to the second direction. That is, not only may the plurality of source contact holes 5*a* be provided intermittently along the extending direction of the trench gate 4, but also the plurality of source contact holes 5*a* may be provided so as not to be aligned with each other in the direction perpendicular to the extending direction of the trench gate 4. According to such a configuration, it is possible to suppress development of a crack in the direction perpendicular to the extending direction of the trench gate 4.

Second Modification

In a cross-sectional view, a side surface of the interlayer insulating film 5 in contact with the source contact hole 5*a* may be inclined so that the source contact hole 5*a* spreads toward the side opposite to the semiconductor substrate. Specifically, in a cross-sectional view, a shape obtained by dividing the source contact hole 5*a* by an imaginary line connecting the upper surfaces of the adjacent interlayer insulating films 5 preferably has a trapezoidal shape with a long upper side and a short lower side. According to such a configuration, since the inclination of a side portion of the recess of the first metal film 8 containing Ni is reduced, it is possible to suppress the density of Ni or the like of the first metal film 8 from becoming sparse, and eventually, it is possible to suppress the corrosion of the metal of the second metal film 9 and occurrence of cracks.

Note that the first and second modifications described above are also applicable to other preferred embodiments described below.

Second Preferred Embodiment

Figure 7:
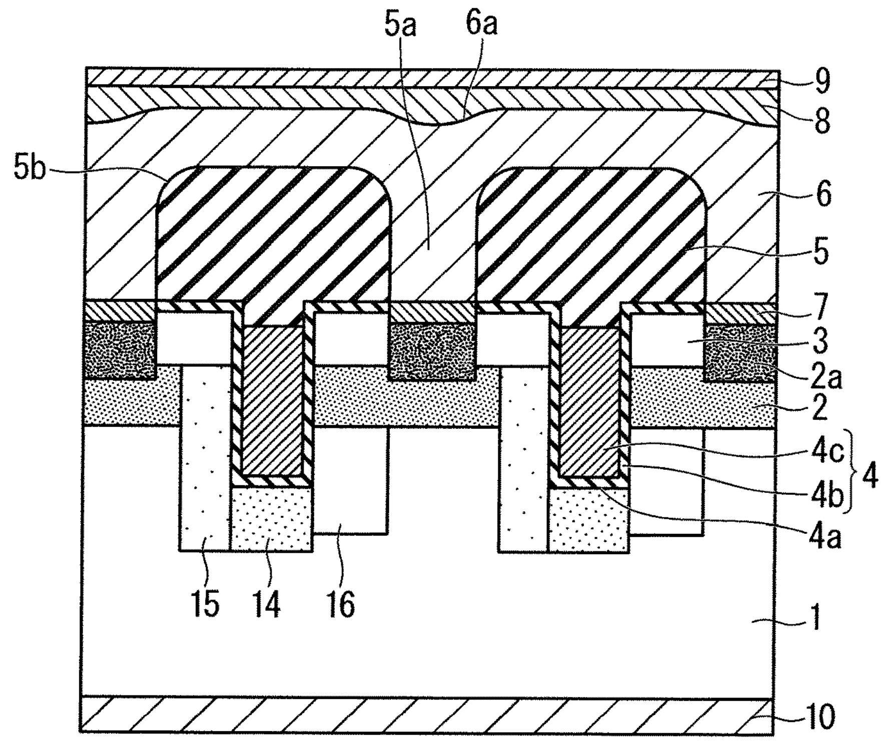
FIG. 7 is a cross-sectional view schematically illustrating a configuration of a MOSFET according to a second preferred embodiment.

FIG. 7 is a cross-sectional view schematically illustrating a configuration of a MOSFET 100 according to the present second preferred embodiment, and is a view corresponding to FIG. 4. The configuration of the MOSFET 100 according to the present second preferred embodiment is similar to the configuration in which a p-type bottom layer 14, a p-type side layer 15, and an n-type semiconductor layer 16 are added to the configuration of FIG. 4.

The bottom layer 14 is provided at a bottom portion of a trench 4*a* of a trench gate 4. The side layer 15 is provided at a side portion of the trench 4*a* and electrically connects the bottom layer 14 and a base layer 2. The n-type semiconductor layer 16 is provided at a side portion of the trench 4*a* where the side layer 15 is not provided, and the n-type impurity concentration of the n-type semiconductor layer 16 is higher than the n-type impurity concentration of a drift layer 1. Note that as formation of the bottom layer 14, the side layer 15, and the like, before forming a gate insulating film 4*b* in the trench 4*a*, an implantation mask is formed at a place where ions are not desired to be introduced, and then ions are implanted into the bottom portion and the side portion of the trench 4*a* at an appropriate angle with respect to the semiconductor substrate. Then, the bottom layer 14, the side layer 15, and the like can be formed by performing heat treatment.

Summary of Second Preferred Embodiment

According to the MOSFET 100 according to the present second preferred embodiment as described above, the bottom layer 14 and the base layer 2 are electrically connected by the side layer 15. According to such a configuration, the p-type bottom layer 14 provided at the bottom portion of the trench 4*a* can be set to the same potential as that of a source electrode 6. As a result, a breakdown voltage of the bottom portion of the trench 4*a* can be secured, and the non-floating bottom layer 14 can react to the switching response of the MOSFET 100. Furthermore, since the capacitance between the gate and the drain (feedback capacitance Crss) can be reduced, reduction of the switching loss can be expected.

Third Preferred Embodiment

Figure 8:
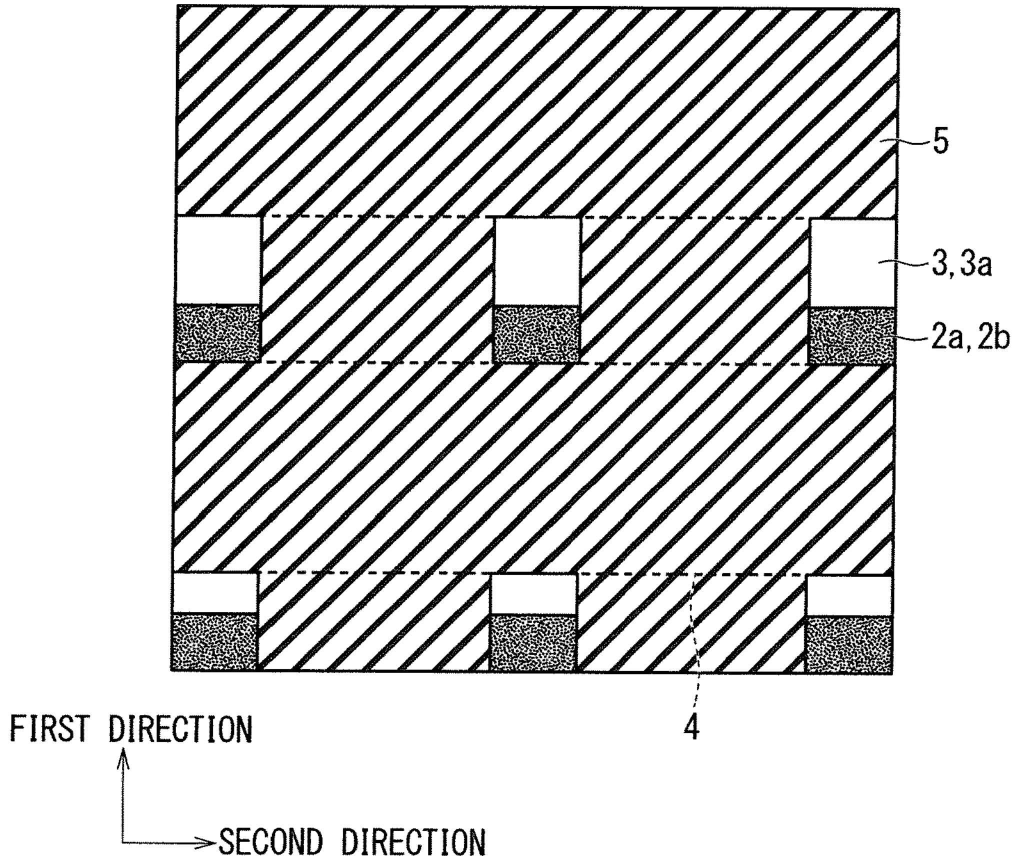
FIGS. 8 and 9 are plan views each schematically illustrating a configuration of part of a MOSFET according to a third preferred embodiment.
Figure 9:
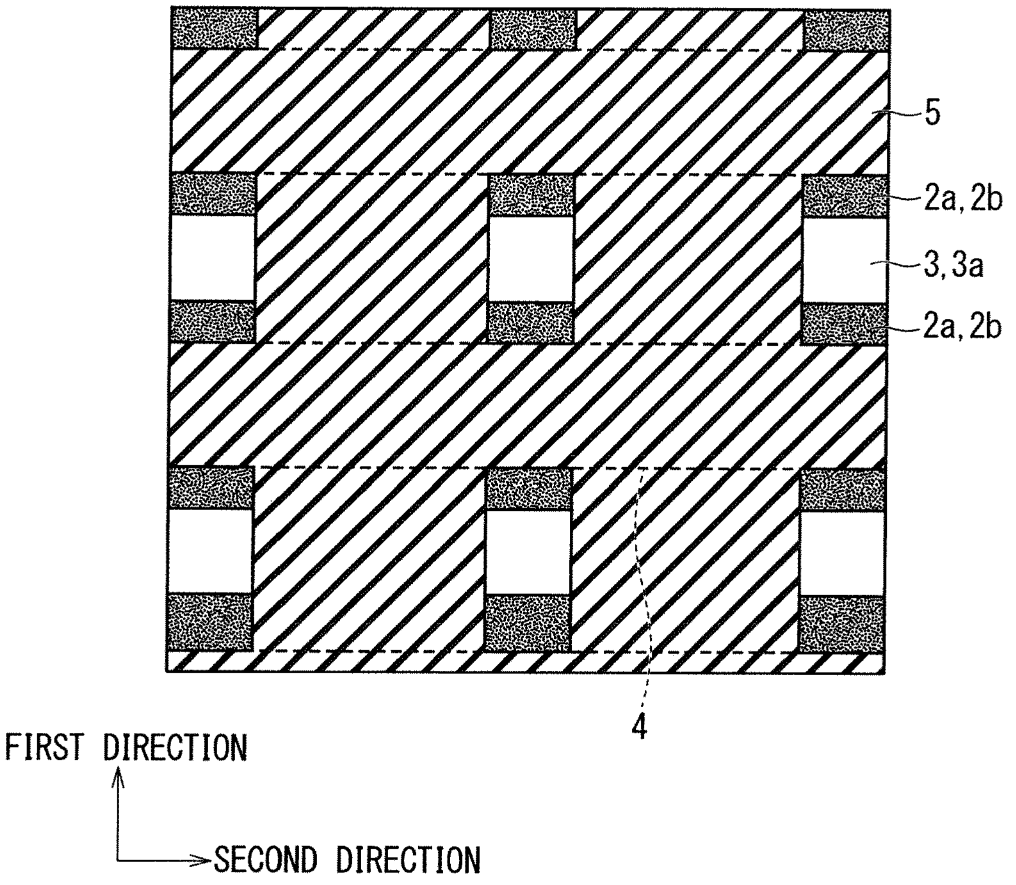

FIGS. 8 and 9 are plan views each schematically illustrating a configuration a MOSFET 100 according to the present third preferred embodiment. In the present third preferred embodiment, as illustrated in FIGS. 8 and 9, one or more first portions 2*b* on the front surface side of a contact layer 2*a* of a base layer 2 and a second portion 3*a* of a source layer 3 overlap a source contact hole 5*a* in a plan view. The one or more first portions 2*b* and the second portion 3*a* are adjacent to each other in the first direction. In FIG. 9, the two first portions 2*b* overlap both end portions of the source contact hole 5*a* in the first direction in a plan view. Note that in the examples of FIGS. 8 and 9, the one or more first portions 2*b* and the second portion 3*a* are adjacent to each other in the first direction, but may be adjacent to each other in the second direction.

Summary of Third Preferred Embodiment

In the MOSFET 100 according to the present third preferred embodiment as described above, the one or more first portions 2*b* and the second portion 3*a* are adjacent to each other and overlap the source contact hole 5*a* in a plan view. According to such a configuration, the current density of the reverse current, that is, the current flowing from a source electrode 6 to a drain electrode 10 can be adjusted. For example, the current density in the reverse direction can be increased as the ratio of the first portion 2*b* overlapping the source contact hole 5*a* increases, and the current density in the forward direction can be increased as the ratio of the second portion 3*a* overlapping the source contact hole 5*a* increases.

Fourth Preferred Embodiment

The present fourth preferred embodiment is an application of the silicon carbide semiconductor device according to any one of the above-described first to third preferred embodiments to a power conversion apparatus. Although the present disclosure is not limited to a specific power conversion apparatus, a case where the present disclosure is applied to a three-phase inverter will be described below as the present fourth preferred embodiment.

Figure 10:
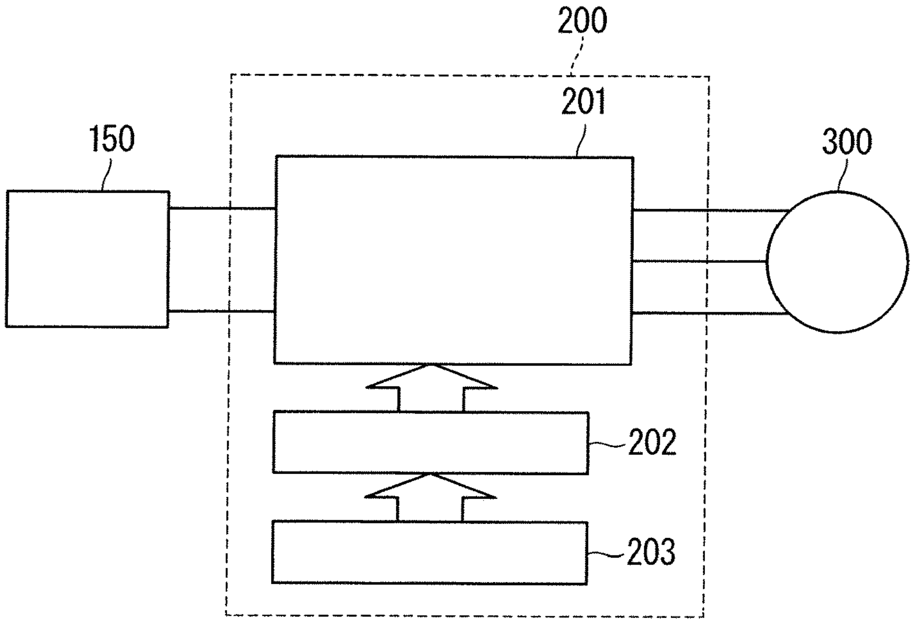
FIG. 10 is a block diagram illustrating a configuration of a power conversion system to which a power conversion apparatus according to a fourth preferred embodiment is applied.

FIG. 10 is a block diagram illustrating a configuration of a power conversion system to which the power conversion apparatus according to the present fourth preferred embodiment is applied. The power conversion system illustrated in FIG. 10 is configured of a power supply 150, a power conversion apparatus 200, and a load 300. The power supply 150 is a DC power supply, and supplies DC power to the power conversion apparatus 200. The power supply 150 can be configured of various things, for example, can be configured of a DC system, a solar cell, or a storage battery, or may be configured of a rectifier circuit connected to an AC system or an AC/DC converter. In addition, the power supply 150 may be configured of a DC/DC converter that converts DC power output from a DC system into predetermined power.

The power conversion apparatus 200 is a three-phase inverter connected between the power supply 150 and the load 300, converts DC power supplied from the power supply 150 into AC power, and supplies the load 300 with AC power. As illustrated in FIG. 10, the power conversion apparatus 200 includes a main conversion circuit 201 which converts DC power into AC power and outputs the AC power, a drive circuit 202 which outputs a drive signal for driving each switching element of the main conversion circuit 201, and a control circuit 203 which outputs a control signal for controlling the drive circuit 202 to the drive circuit 202.

The load 300 is a three-phase motor driven by AC power supplied from the power conversion apparatus 200. Note that the load 300 is not limited to a specific application, and is a motor mounted on various electric apparatuses, and is used as, for example, a motor for a hybrid car, an electric car, a rail car, an elevator, or an air conditioner.

Hereinafter, details of the power conversion apparatus 200 will be described. The main conversion circuit 201 includes a switching element (not illustrated), and the switching element performs switching to convert DC power supplied from the power supply 150 into AC power and supplies the AC power to the load 300. Although there are various specific circuit configurations of the main conversion circuit 201, the main conversion circuit 201 according to the present fourth preferred embodiment is a two-level three-phase full bridge circuit, and can be configured of six switching elements. The silicon carbide semiconductor device according to any one of the above-described first to third preferred embodiments is applied to each switching element of the main conversion circuit 201. Every two switching elements among the six switching elements are connected in series to constitute upper and lower arms, and the upper and lower arms constitute phases (U phase, V phase, W phase) of the full bridge circuit, respectively. Output terminals of the upper and lower arms, that is, three output terminals of the main conversion circuit 201, are connected to the load 300.

The drive circuit 202 generates a drive signal for driving the switching element of the main conversion circuit 201, and supplies the drive signal to a control electrode of the switching element of the main conversion circuit 201. Specifically, in accordance with a control signal from a control circuit 203 described later, a drive signal for turning on the switching element and a drive signal for turning off the switching element are output to the control electrode of each switching element. In a case where the switching element is maintained in the on state, the drive signal is a voltage signal (on signal) equal to or higher than a threshold voltage of the switching element, and in a case where the switching element is maintained in an off state, the drive signal is a voltage signal (off signal) lower than the threshold voltage of the switching element.

The control circuit 203 controls the switching elements of the main conversion circuit 201 so that desired power is supplied to the load 300. Specifically, the control circuit 203 calculates the time (on time) in which each switching element of the main conversion circuit 201 should be turned on according to power to be supplied to the load 300. For example, the main conversion circuit 201 can be controlled by PWM control of modulating the on time of the switching element according to the voltage to be output. Then, the control circuit 203 outputs a control command (control signal) to the drive circuit 202 so that the on signal is output to the switching element to be turned on at each time point and the off signal is output to the switching element to be turned off at each time point. The drive circuit 202 outputs the on signal or the off signal as a drive signal to the control electrode of each switching element according to this control signal.

In the power conversion apparatus according to the present fourth preferred embodiment, since the silicon carbide semiconductor devices according to any one of the first to third preferred embodiments are applied as the switching elements of the main conversion circuit 201, occurrence of cracks in the silicon carbide semiconductor device can be suppressed.

In the present fourth preferred embodiment, an example in which the present disclosure is applied to the two-level three-phase inverter has been described; however, the present disclosure is not limited to this, and can be applied to various power conversion apparatuses. The power conversion apparatus according to the present fourth preferred embodiment is the two-level power conversion apparatus, but may be a three-level or multi-level power conversion apparatus, and in a case of supplying power to a single-phase load, the present disclosure may be applied to a single-phase inverter. In addition, in a case of supplying power to a DC load or the like, the present disclosure can be applied to a DC/DC converter or an AC/DC converter.

In addition, the power conversion apparatus to which the present disclosure is applied is not limited to the case where the load described above is a motor, and, for example, may be used as a power supply apparatus of an electric discharge machine, a laser machine, an induction heating cooker, or a noncontact power supply system, and can also be used as a power conditioner of a solar power generation system, a storage system, or the like.

Note that the preferred embodiments and the modifications can be freely combined, and the preferred embodiments and the modifications can be appropriately modified or omitted.

Hereinafter, various aspects of the present disclosure will be collectively described as appendixes.

APPENDIX 1

A silicon carbide semiconductor device comprising:

a drift layer of a first conductivity type that is provided between a first main surface and a second main surface of a semiconductor substrate;

a base layer of a second conductivity type that is provided on a first main surface side of the drift layer;

a source layer of the first conductivity type that is selectively provided on a first main surface side of the base layer;

a trench gate that has a gate electrode provided via a gate insulating film on an inner surface of each of a plurality of trenches, the plurality of trenches being provided side by side in a first direction and extending in a second direction in a plan view, and in contact with the base layer and the source layer in a cross-sectional view;

an insulating film that has a plurality of source contact holes intermittently provided in the second direction along the trench gate in a plan view, and is provided on the first main surface in a cross-sectional view;

a source electrode that is provided on the insulating film and is electrically connected to the source layer via the plurality of source contact holes;

a first metal film that is provided on the source electrode and contains nickel; and a second metal film that is provided on the first metal film and contains a metal having a lower ionization tendency than ionization tendency of the first metal film, wherein intermittent recesses reflecting shapes of the plurality of source contact holes are provided on a surface of the source electrode on a side opposite to the semiconductor substrate.

APPENDIX 2

The silicon carbide semiconductor device according to appendix 1, wherein a shape of each of the plurality of source contact holes in a plan view is a line shape, a rectangular shape, a circular shape, or a square shape.

APPENDIX 3

The silicon carbide semiconductor device according to appendix 1 or 2, wherein the plurality of source contact holes in a plan view is arranged side by side in the first direction and is arranged asymmetrically with respect to the second direction.

APPENDIX 4

The silicon carbide semiconductor device according to any one of appendixes 1 to 3, further comprising a silicide layer that contains nickel and that makes ohmic connection between the source electrode and at least one of the base layer and the source layer.

APPENDIX 5

The silicon carbide semiconductor device according to any one of appendixes 1 to 4, further comprising:

a bottom layer of the second conductivity type provided at a bottom portion of the trench; and a side layer of the second conductivity type that is provided at a side portion of the trench and electrically connects the bottom layer and the base layer.

APPENDIX 6

The silicon carbide semiconductor device according to any one of appendixes 1 to 5, wherein one or more first portions on the first main surface side of the base layer and a second portion on a first main surface side of the source layer are adjacent to each other and overlap one of the plurality of source contact holes in a plan view.

APPENDIX 7

The silicon carbide semiconductor device according to appendix 6, wherein the two first portions overlap both end portions of one of the plurality of source contact holes in the first direction in a plan view.

APPENDIX 8

The silicon carbide semiconductor device according to any one of appendixes 1 to 7, wherein a side surface of the insulating film in contact with one of the plurality of source contact holes is inclined such that the one of the plurality of source contact holes spreads toward a side opposite to the semiconductor substrate in a cross-sectional view.

APPENDIX 9

The silicon carbide semiconductor device according to any one of appendixes 1 to 8, wherein a curved surface is provided between a side surface of the insulating film in contact with one of the plurality of source contact holes and a surface of the insulating film on a side opposite to the semiconductor substrate in a cross-sectional view.

APPENDIX 10

A power conversion apparatus comprising:

a main conversion circuit that has the silicon carbide semiconductor device according to any one of appendixes 1 to 9, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

While the disclosure has been shown and described in detail, the foregoing description is in all aspects illustrative and not restrictive. It is therefore understood that numerous modifications and variations can be devised.

What is claimed is:

1. A silicon carbide semiconductor device comprising:

a drift layer of a first conductivity type that is provided between a first main surface and a second main surface of a semiconductor substrate;

a base layer of a second conductivity type that is provided on a first main surface side of the drift layer;

a source layer of the first conductivity type that is selectively provided on a first main surface side of the base layer;

a trench gate that has a gate electrode provided via a gate insulating film on an inner surface of each of a plurality of trenches, the plurality of trenches being provided side by side in a first direction and extending in a second direction in a plan view, and in contact with the base layer and the source layer in a cross-sectional view;

an insulating film that has a plurality of source contact holes intermittently provided in the second direction along the trench gate in the plan view, and is provided on the first main surface in a cross-sectional view;

a source electrode that is provided on the insulating film and is electrically connected to the source layer via the plurality of source contact holes;

a first metal film that is provided on the source electrode and contains nickel; and a second metal film that is provided on the first metal film and contains a metal having a lower ionization tendency than ionization tendency of the first metal film, wherein intermittent recesses reflecting shapes of the plurality of source contact holes are provided on a surface of the source electrode on a side opposite to the semiconductor substrate, and lengths of the plurality of source contact holes are longer than distances between the plurality of source contact holes in the second direction.

2. The silicon carbide semiconductor device according to claim 1, wherein a shape of each of the plurality of source contact holes in the plan view is a line shape, a rectangular shape, a circular shape, or a square shape.

3. A silicon carbide semiconductor device comprising:

a drift layer of a first conductivity type that is provided between a first main surface and a second main surface of a semiconductor substrate;

a base layer of a second conductivity type that is provided on a first main surface side of the drift layer;

a source layer of the first conductivity type that is selectively provided on a first main surface side of the base layer;

a trench gate that has a gate electrode provided via a gate insulating film on an inner surface of each of a plurality of trenches, the plurality of trenches being provided side by side in a first direction and extending in a second direction in a plan view, and in contact with the base layer and the source layer in a cross-sectional view;

an insulating film that has a plurality of source contact holes intermittently provided in the second direction along the trench gate in the plan view, and is provided on the first main surface in a cross-sectional view;

a source electrode that is provided on the insulating film and is electrically connected to the source layer via the plurality of source contact holes;

a first metal film that is provided on the source electrode and contains nickel; and a second metal film that is provided on the first metal film and contains a metal having a lower ionization tendency than ionization tendency of the first metal film, wherein intermittent recesses reflecting shapes of the plurality of source contact holes are provided on a surface of the source electrode on a side opposite to the semiconductor substrate, and the plurality of source contact holes in the plan view is arranged side by side in the first direction and is arranged asymmetrically with respect to the second direction.

4. The silicon carbide semiconductor device according to claim 1, further comprising a silicide layer that contains nickel and that makes ohmic connection between the source electrode and at least one of the base layer and the source layer.

5. The silicon carbide semiconductor device according to claim 1, further comprising:

a bottom layer of the second conductivity type provided at a bottom portion of the trench; and a side layer of the second conductivity type that is provided at a side portion of the trench and electrically connects the bottom layer and the base layer.

6. A silicon carbide semiconductor device comprising:

a drift layer of a first conductivity type that is provided between a first main surface and a second main surface of a semiconductor substrate;

a base layer of a second conductivity type that is provided on a first main surface side of the drift layer;

a source layer of the first conductivity type that is selectively provided on a first main surface side of the base layer;

a trench gate that has a gate electrode provided via a gate insulating film on an inner surface of each of a plurality of trenches, the plurality of trenches being provided side by side in a first direction and extending in a second direction in a plan view, and in contact with the base layer and the source layer in a cross-sectional view;

an insulating film that has a plurality of source contact holes intermittently provided in the second direction along the trench gate in the plan view, and is provided on the first main surface in a cross-sectional view;

a source electrode that is provided on the insulating film and is electrically connected to the source layer via the plurality of source contact holes;

a first metal film that is provided on the source electrode and contains nickel; and a second metal film that is provided on the first metal film and contains a metal having a lower ionization tendency than ionization tendency of the first metal film, wherein intermittent recesses reflecting shapes of the plurality of source contact holes are provided on a surface of the source electrode on a side opposite to the semiconductor substrate, and one or more first portions on the first main surface side of the base layer and a second portion on a first main surface side of the source layer are adjacent to each other and overlap one of the plurality of source contact holes in the plan view.

7. The silicon carbide semiconductor device according to claim 6, wherein the two first portions overlap both end portions of one of the plurality of source contact holes in the first direction in the plan view.

8. A silicon carbide semiconductor device comprising:

a drift layer of a first conductivity type that is provided between a first main surface and a second main surface of a semiconductor substrate;

a base layer of a second conductivity type that is provided on a first main surface side of the drift layer;

a source layer of the first conductivity type that is selectively provided on a first main surface side of the base layer;

a trench gate that has a gate electrode provided via a gate insulating film on an inner surface of each of a plurality of trenches, the plurality of trenches being provided side by side in a first direction and extending in a second direction in a plan view, and in contact with the base layer and the source layer in a cross-sectional view;

an insulating film that has a plurality of source contact holes intermittently provided in the second direction along the trench gate in the plan view, and is provided on the first main surface in a cross-sectional view;

a source electrode that is provided on the insulating film and is electrically connected to the source layer via the plurality of source contact holes;

a first metal film that is provided on the source electrode and contains nickel; and a second metal film that is provided on the first metal film and contains a metal having a lower ionization tendency than ionization tendency of the first metal film, wherein intermittent recesses reflecting shapes of the plurality of source contact holes are provided on a surface of the source electrode on a side opposite to the semiconductor substrate, and a side surface of the insulating film in contact with one of the plurality of source contact holes is inclined such that the one of the plurality of source contact holes spreads toward a side opposite to the semiconductor substrate in a cross-sectional view.

9. A silicon carbide semiconductor device comprising:

a drift layer of a first conductivity type that is provided between a first main surface and a second main surface of a semiconductor substrate;

a base layer of a second conductivity type that is provided on a first main surface side of the drift layer;

a source layer of the first conductivity type that is selectively provided on a first main surface side of the base layer;

a trench gate that has a gate electrode provided via a gate insulating film on an inner surface of each of a plurality of trenches, the plurality of trenches being provided side by side in a first direction and extending in a second direction in a plan view, and in contact with the base layer and the source layer in a cross-sectional view;

an insulating film that has a plurality of source contact holes intermittently provided in the second direction along the trench gate in the plan view, and is provided on the first main surface in a cross-sectional view;

a source electrode that is provided on the insulating film and is electrically connected to the source layer via the plurality of source contact holes;

a first metal film that is provided on the source electrode and contains nickel; and a second metal film that is provided on the first metal film and contains a metal having a lower ionization tendency than ionization tendency of the first metal film, wherein intermittent recesses reflecting shapes of the plurality of source contact holes are provided on a surface of the source electrode on a side opposite to the semiconductor substrate, and a curved surface is provided between a side surface of the insulating film in contact with one of the plurality of source contact holes and a surface of the insulating film on a side opposite to the semiconductor substrate in a cross-sectional view.

10. A power conversion apparatus comprising:

a main conversion circuit that has the silicon carbide semiconductor device according to claim 1, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

11. A power conversion apparatus comprising:

a main conversion circuit that has the silicon carbide semiconductor device according to claim 2, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

12. A power conversion apparatus comprising:

a main conversion circuit that has the silicon carbide semiconductor device according to claim 3, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

13. A power conversion apparatus comprising:

a main conversion circuit that has the silicon carbide semiconductor device according to claim 4, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

14. A power conversion apparatus comprising:

a main conversion circuit that has the silicon carbide semiconductor device according to claim 5, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

15. A power conversion apparatus comprising:

a main conversion circuit that has the silicon carbide semiconductor device according to claim 6, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

16. A power conversion apparatus comprising:

a main conversion circuit that has the silicon carbide semiconductor device according to claim 7, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

17. A power conversion apparatus comprising:

a main conversion circuit that has the silicon carbide semiconductor device according to claim 8, and converts power that is input and outputs the power;

a drive circuit that outputs a drive signal for driving the silicon carbide semiconductor device to the silicon carbide semiconductor device; and a control circuit that outputs a control signal for controlling the drive circuit to the drive circuit.

18. A power conversion apparatus comprising:

a main conversion circuit that has the silicon carbide semiconductor device according to claim 9, and converts power that is input and outputs the power, a drive circuit that outputs a drive signal for driving the silicon carbide semiconductor device to the silicon carbide semiconductor device; and a control circuit that outputs a control signal for controlling the drive circuit to the drive circuit.

19. The silicon carbide semiconductor device according to claim 3, wherein the plurality of source contact holes is offset with each other in the first direction.

* * * * *